United States Patent
Fernald

(10) Patent No.: US 10,296,025 B2
(45) Date of Patent: May 21, 2019

(54) APPARATUS FOR ELECTRIC CURRENT MEASUREMENT OR CALIBRATION AND ASSOCIATED METHODS

(71) Applicant: Silicon Laboratories Inc., Austin, TX (US)

(72) Inventor: Kenneth W. Fernald, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 252 days.

(21) Appl. No.: 15/196,000

(22) Filed: Jun. 28, 2016

(65) Prior Publication Data
US 2017/0371362 A1    Dec. 28, 2017

(51) Int. Cl.
*G05F 1/46*    (2006.01)
*G01R 19/00*    (2006.01)

(52) U.S. Cl.
CPC ........... *G05F 1/46* (2013.01); *G01R 19/0092* (2013.01)

(58) Field of Classification Search
CPC .............................. G05F 1/46; G01R 19/0092
USPC .......................................... 327/538, 378, 77
See application file for complete search history.

(56) References Cited

U.S. PATENT DOCUMENTS

2009/0096488 A1* 4/2009 Han ........................ H03K 5/135
                                                                  327/77

* cited by examiner

*Primary Examiner* — Thomas Skibinski
(74) *Attorney, Agent, or Firm* — Law Offices of Maximilian R. Peterson

(57) ABSTRACT

An apparatus includes an integrated circuit (IC). The IC includes a current source, to sink or source an output current, in response to a control signal, and a switch-capacitor resistor coupled to the current source. The apparatus further includes a controller coupled to derive the control signal from a voltage across the switch-capacitor resistor, the controller further to provide a switch control signal to the switch-capacitor resistor.

20 Claims, 12 Drawing Sheets

APPARATUS FOR ELECTRIC CURRENT MEASUREMENT OR CALIBRATION AND ASSOCIATED METHODS

TECHNICAL FIELD

The disclosure relates generally to apparatus for generating and/or calibrating electrical signals and, more particularly, to apparatus for generating and/or calibrating electric currents and associated methods.

BACKGROUND

Electronic circuits often operate on or process both analog and digital signals, sometimes called mixed-signal. Some sensors or transducers as well as natural properties or attributes, such as temperature, pressure, and the like, either constitute analog quantities or, in the case of sensors, often produce analog signals. Also, some transducers accept as inputs analog signals. Conversely, signal-processing circuits and building blocks increasingly use digital signals and digital techniques for reasons such as repeatability, stability, flexibility, and the like, as person of ordinary skill in the art understand. To interface the signal-processing circuits with analog circuits, signal conversion circuits are used. In addition, standalone analog circuitry are often used in electronic circuits, such as integrated circuits (ICs).

Because of the above developments and trends, a variety of analog circuitry (either alone or in a mixed-signal context) are used to perform a number of tasks, such as amplification, comparison, signal conversion, and the like. Analog circuitry often uses one or more types of signal sources, such as voltage sources or current sources. In the case of ICs, the current signals are usually generated using circuitry integrated in the IC, sometimes also using one or more external signals provided to the IC. Calibration of current signals (e.g., bias currents) of relatively small values are usually performed by amplifying the current (even though doing so introduces errors), and measuring the amplified current.

The description in this section and any corresponding figure(s) are included as background information materials. The materials in this section should not be considered as an admission that such materials constitute prior art to the present patent application.

SUMMARY

A variety of current calibration apparatus and associated methods are contemplated. According to one exemplary embodiment, an apparatus includes an IC. The IC includes a current source, to sink or source an output current, in response to a control signal, and a switch-capacitor resistor coupled to the current source. The apparatus further includes a controller coupled to derive the control signal from a voltage across the switch-capacitor resistor, the controller further to provide a switch control signal to the switch-capacitor resistor.

According to another exemplary embodiment, an apparatus includes a microcontroller unit (MCU). The MCU includes a current source, to sink or source an output current, in response to a control signal, and a signal processing circuit coupled to receive a voltage across the switch-capacitor resistor and to provide an output signal, the signal processing circuit having an offset voltage. The apparatus further includes a controller coupled to derive the control signal from the output signal of the signal processing circuit and the offset voltage, the controller further to provide a switch control signal to the switch-capacitor resistor.

According to another exemplary embodiment, a method includes sinking or sourcing an output current from a current source in response to a control signal, and providing the output current to a switch-capacitor resistor. The method further includes deriving the control signal from a voltage across the switch-capacitor resistor, and providing a switch control signal to the switch-capacitor resistor.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
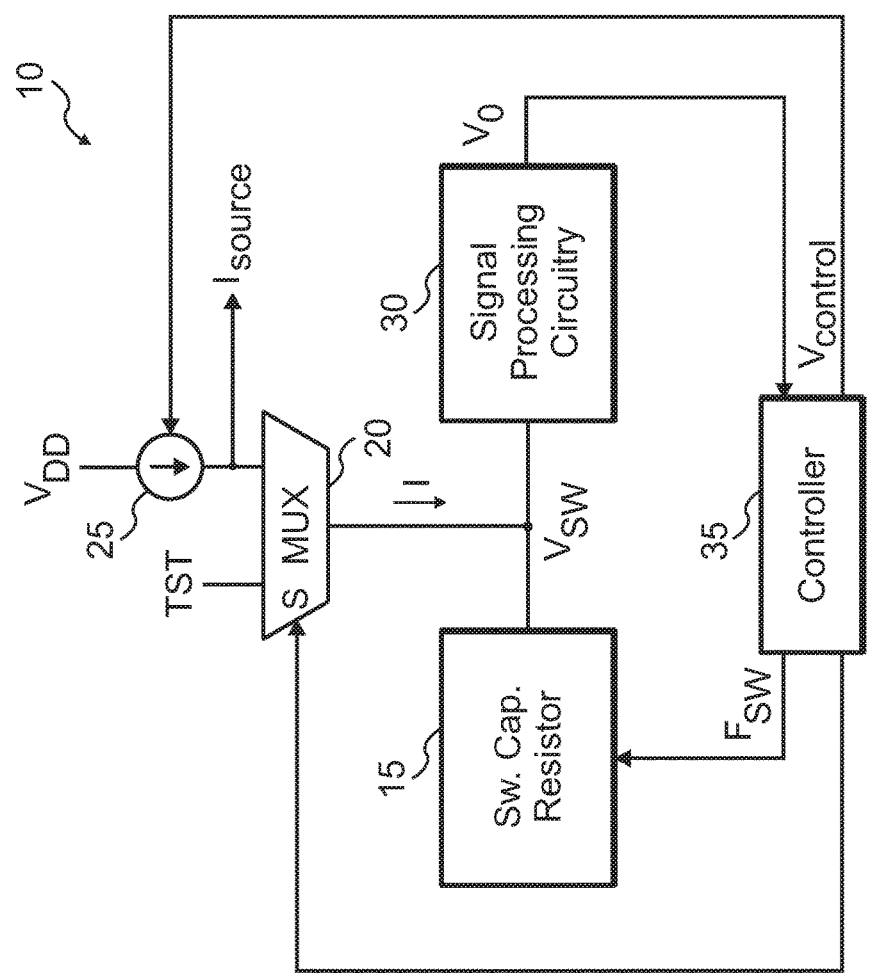
FIG. 1 illustrates a circuit arrangement for an apparatus for measurement and/or calibration of electric currents according to an exemplary embodiment.

The disclosed concepts relate generally to calibration apparatus. More specifically, the disclosed concepts provide apparatus and methods for calibrating currents with relatively low values.

Currents with relatively low values tend to become increasingly more common in electronic apparatus, such as ICs. One factor giving rise to the smaller currents has been the general decrease in the IC feature sizes and supply currents and voltages. Another factor has been the increasing proliferation of mobile or wireless technology, such as Wi-Fi, Bluetooth, and mobile (e.g., phones, such as GSM phones, etc.) or wireless (such as pointing devices, keyboards, etc.) Internet of things (IoT) devices. To reduce the cost, size, and bill of materials, and to increase the reliability of such devices or systems, various circuits or functions have been integrated into ICs. Given the mobile or wireless nature of such apparatus, smaller current signals, such as bias currents, have been used to reduce the power consumption of the apparatus and, hence, the load on the mobile power source (e.g., battery, solar cell, etc.).

In exemplary embodiments, apparatus and associated methods are used to measure and/or calibrate relatively small currents, such as bias currents with relatively high accuracy. The current levels vary according to various factors, as persons of ordinary skill in the art will understand. Such factors include design specifications, performance specifications, cost, IC or device area, available technology, (such as semiconductor fabrication technology), target markets, target end-users, etc. In some embodiments, the current levels range from below 1 to 10s of nanoamperes. In some embodiments, the current levels range from 10s of nanoamperes to 10s of microamperes, whereas in other embodiments, the current levels range from 10s of microamperes to over a milliampere. Other current levels may be used in other embodiments, as persons of ordinary skill in the art will understand.

As noted, exemplary embodiments provide techniques and apparatus for measuring relatively small currents. Such techniques and apparatus are useful because accuracies of relatively small currents vary as function of semiconductor fabrication process variations (e.g., among semiconductor die or among semiconductor wafers), mismatch among components (e.g., lack of 100% matching between two transistors or among a number of transistors), etc. To address such effects on the accuracies of relatively small currents, calibration of the currents may be used. Exemplary embodiments further provide techniques and apparatus for calibrating relatively small currents. Calibration may include both electrical changes (e.g., using electrically controlled switches in the current generator circuitry) or physical changes (e.g., via laser trimming of resistors in the current generator circuitry).

Exemplary embodiments according to the disclosure provide an on-chip (i.e., a solution integrated within an IC) circuit and associated methods for measuring and/or calibrating currents, for example, relatively small currents, without routing or conducting the current to a pin of the IC (or a circuit external to the IC), and without introducing significant new sources of inaccuracy, such as inaccuracies that cannot be corrected by the calibration procedure. The measurement and/or calibration of current in exemplary embodiments uses a property of the switch-capacitor resistor, namely that the resistance of a switch-capacitor resistor is scalable relatively accurately by scaling the frequency at which the switch-capacitor resistor operates.

FIG. 1 illustrates a circuit arrangement 10 for an apparatus for measurement and/or calibration of electric currents according to an exemplary embodiment. The embodiment shown in FIG. 1 includes switch-capacitor resistor 15, multiplexer (MUX) 20, current source 25, signal processing circuit 30, and controller 35.

Circuit arrangement 10 may be used to calibrate and/or measure the output current $I_{source}$ provided by current source 25. In exemplary embodiments, current source 25 is a controllable current source. More particularly, in response to a signal from controller 35, such as $V_{control}$, the output current $I_{source}$ can be changed (or controlled, set, varied, trimmed, programmed, configured, etc.). Thus, in the embodiment shown, current source 25 constitutes a voltage controlled current source (VCCS).

Switch-capacitor resistor 15, described below in detail, includes a controllable switch (not shown). In response to a switch control signal, $F_{sw}$, from controller 35, the switch opens and closes, which causes the output voltage, $V_{sw}$, of switch-capacitor 15 to vary. The output voltage of switch-capacitor 15 drives the input of signal processing circuit 30.

In response to a select signal, S, from controller 35, MUX 20 provides either the output current of current source 25 or a test signal or test current signal, $I_{TST}$, supplied via the TST input, to the input of signal processing circuit 30 as current I. Signal processing circuit 30 performs signal processing, such as filtering and buffering, as described below in details. Signal processing circuit 30 provides an output voltage, $V_o$, to controller 35.

In response to signal $V_o$, controller 35 provides signal $F_{sw}$ to switch-capacitor 15. In addition, controller 35 provides control signal $V_{control}$ to current source 25. In response to the control signal $V_{control}$, current source 25 provides an output current ($I_{source}$) whose value corresponds to the value of control signal $V_{control}$ (in the example shown, current source 25 is a voltage controlled current source, as described below).

Note that a variety of alternatives to circuit arrangement 10 are possible and contemplated. For example, although circuit arrangement 10 shows a single current source 25, one or more additional current sources 25 may be used by making appropriate modifications, as persons of ordinary skill in the art will understand. Examples of such modifications include adding more inputs to MUX 20, and modifying controller 35 to control current sources 25 (e.g., by using additional control signals, such as additional $V_{control}$).

As another example of an alternative, a different type of current source may be used. As noted above, current source 25 is a voltage controlled current source (VCCS). In some embodiments, current source 25 may constitute a current controlled current source (CCCS). In such a scenario, controller 35 provides a current control signal to current source 25, rather than the voltage control signal, $V_{control}$, as FIG. 1 shows. In other embodiments, current source 25 may constitute a digitally-controlled current source. In such a scenario, controller 35 provides a digital control vector or signal to current source 25, rather than the voltage control signal, $V_{control}$, as FIG. 1 shows.

In the embodiment illustrated in FIG. 1, current source 25 sinks current from the supply voltage, $V_{DD}$, and sources current into MUX 20. The $V_{DD}$ supply constitutes merely one example of a coupling to current source 25, and other embodiments may couple current source 25 to some signal other than $V_{DD}$. In addition, in other embodiments current source 25 may sink current from MUX 20. The detailed design of various blocks shown in FIG. 1 may be different in other embodiments depending on whether current source 25 sinks or sources current into MUX 20, as described in more detail below.

Figure 2:
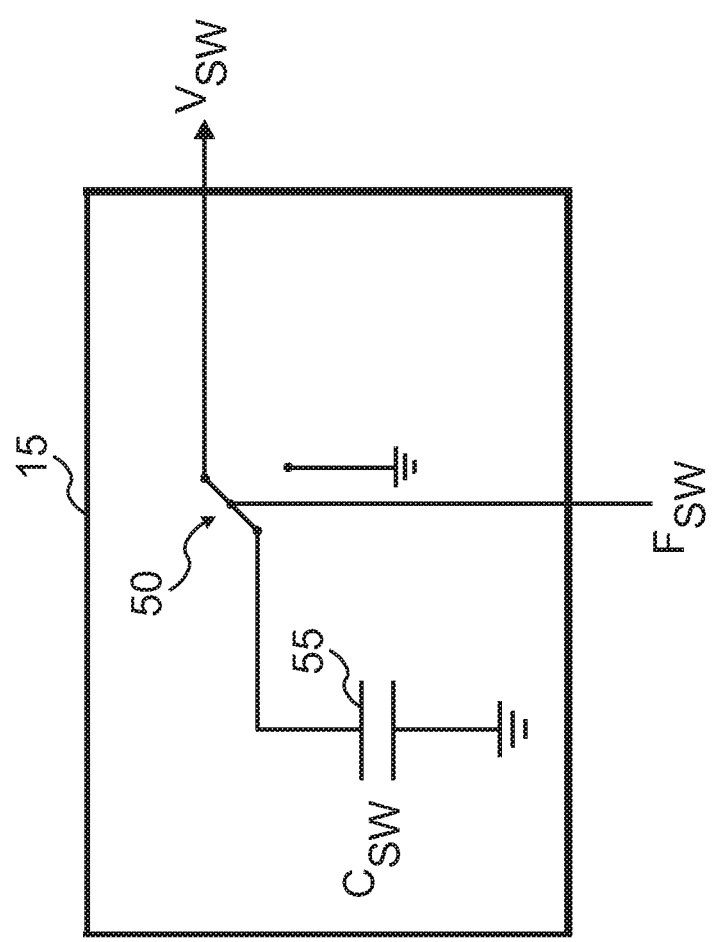
FIG. 2 depicts a circuit arrangement for a switch-capacitor resistor according to an exemplary embodiment.

FIG. 2 depicts a circuit arrangement for switch-capacitor resistor 15 according to an exemplary embodiment. Switch-capacitor 15 includes switch 50, and capacitor 55 ($C_{sw}$). Capacitor 55 is coupled between ground potential (e.g., $V_{SS}$) and switch 50. In response to switch control signal $F_{sw}$, switch 50 couples capacitor 50 to either the output voltage $V_{sw}$ (position 1 of switch 50) or to the ground potential (position 2 of switch 50). In other embodiments where current source 25 sinks current from MUX 20, switch 50 would generally be coupled to a potential higher than the ground potential, such as the $V_{DD}$ potential, as would be understood by persons of ordinary skill in the art. Similarly, capacitor 55 would generally be coupled to that same higher potential, rather than coupled to the ground potential.

Referring to FIGS. 1 and 2, note that the output of switch-capacitor resistor 15 is coupled to the output of MUX 20. When switch 50 is in position 1 (in response to switch control signal $F_{sw}$, for example, when switch control signal $F_{sw}$ has a binary 1 or logic high value), switch 50 couples capacitor 55 to the output voltage $V_{sw}$, which causes capacitor 55 to charge. Conversely, when switch 50 is in position 2 (in response to switch control signal $F_{sw}$, for example, when switch control signal $F_{sw}$ has a binary 0 or logic low value), switch 50 couples capacitor 55 to the ground potential, which causes capacitor 55 to discharge.

The switching action of switch 50 results in the current into switch-capacitor resistor 15 being proportional, on average, to the voltage across the switch-capacitor resistor 15 (i.e., output voltage $V_{sw}$), similar to an ordinary resistor. As noted above, when switch 50 is in position 1 (the up position), capacitor 55 is charged to the voltage present at the node between switch-capacitor resistor 15, MUX 20, and signal processing circuit 30, i.e., $V_{sw}$. When capacitor 55 is switched to ground using position 2 (the down position) of switch 50, capacitor 55 is discharged to the ground potential, zero volts.

Given that the charge Q on a capacitor having a capacitance C is given by the well-known equation Q=C·V, where V represents the voltage across the capacitor, the charge moved from $V_{sw}$ to the ground node each time the switching sequence (described above) repeats is given by $C_{sw} \cdot V_{sw}$. If the switching sequence is repeated every $T_{SW}$ seconds, where $T_{SW}$ is the inverse of $F_{sw}$, i.e., $1/F_{sw}$, the rate of charge moved from $V_{sw}$ to the ground node is given by $C_{sw} \cdot V_{sw}/T_{SW}$.

Because current is a measure of charge flow per second, the quantity $C_{sw} \cdot V_{sw}/T_{SW}$ represents the average current through switch-capacitor resistor 15. By replacing $1/T_{sw}$ with a frequency, i.e., $F_{sw}$, the following equation may be written, $$I_{sw} = C_{sw} \cdot V_{sw} \cdot F_{sw},\qquad\text{[Equation 1]}$$

where $I_{sw}$ denotes the average current through switch-capacitor resistor 15. Ohm's Law states that resistance of an element or circuit is equal to voltage divided by current. Consequently, Equation 1 may be written as:

$$R_{sw} = V_{sw}/I_{sw},\qquad\text{[Equation 2]}$$

or $$R_{sw} = 1/(C_{sw} \cdot F_{sw}),\qquad\text{[Equation 3]}$$

where $R_{sw}$ represents the effective resistance of switch-capacitor resistor 15. As Equation 3 indicates, for a given amount of capacitance $C_{sw}$, the resistance of switch-capacitor resistor 15 varies inversely with changes in the frequency $F_{sw}$. Thus, by varying the frequency of switch control signal $F_{sw}$, controller 35 can control the resistance of switch-capacitor resistor 15. For example, by doubling the frequency $F_{sw}$, the resistance of switch-capacitor resistor 15 can be cut in half, and vice-versa. Note that this property is not affected by the capacitance value $C_{sw}$. This attribute of switch-capacitor resistors is used to calibrate and/or measure currents with relatively high accuracy.

Figure 3:
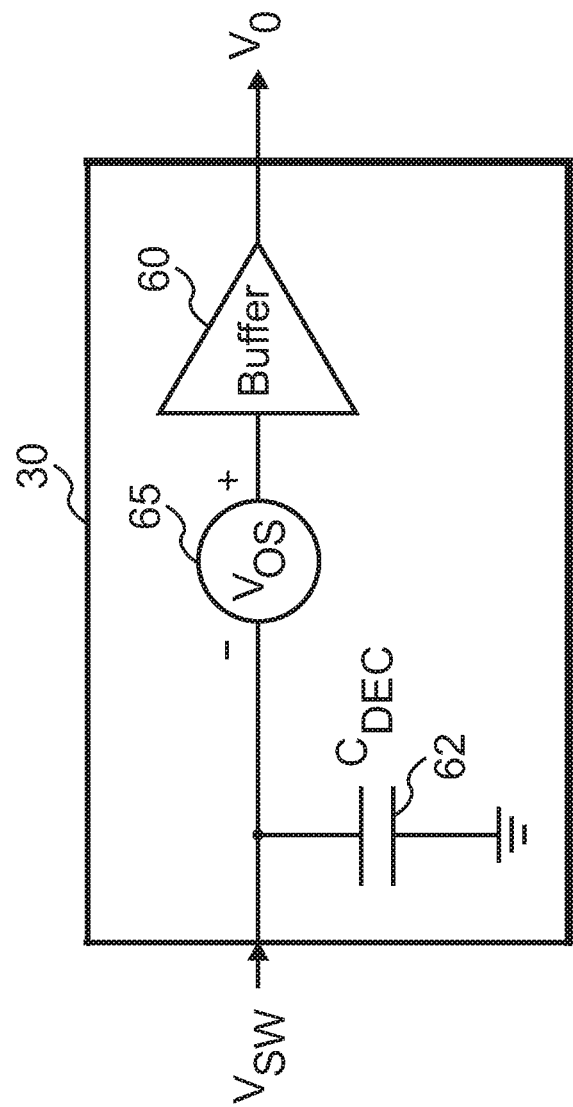
FIG. 3 shows a circuit arrangement for a signal processing circuit according to an exemplary embodiment.

Referring to FIGS. 1-3, the switching action of switch 50 generates output voltage $V_{sw}$, which is applied across capacitor 62 ($C_{DEC}$) due to the current (e.g., current I) passing through switch-capacitor resistor 15. The resulting average voltage equals $I \cdot R_{sw}$, or more specifically $I/(C_{sw} \cdot F_{sw})$. The capacitance of capacitor 62 is sufficiently large (e.g., by a factor of 100, in some embodiments, for example, $C_{sw}=0.1$ pF and $C_{DEC}=10$ pF) compared to capacitor 55 (and parasitic capacitances related to switch 50) to sufficiently suppress the ripple due to the clocking or switching action of switch-capacitor resistor 15.

In exemplary embodiments, switch 50 may be implemented in a variety of ways, as persons of ordinary skill in the art will understand. For example, in some embodiments, switch 50 may be implemented using transistors, such as metal oxide semiconductor field effect transistors (MOSFETs). In some embodiments, a p-channel MOSFET may be used to couple $C_{sw}$ to $V_{sw}$, and an n-channel MOSFET may be used to couple $C_{sw}$ to ground. The p-channel MOSFET may be coupled with its source coupled to $V_{sw}$, the drain coupled to $C_{sw}$, and its gate coupled to receive switch control signal $F_{sw}$. When switch control signal $F_{sw}$ has a logic low value, the p-channel MOSFET turns on, and charges capacitor 55. The n-channel MOSFET may be coupled with its source coupled to ground, its drain coupled to $C_{sw}$, and its gate coupled to receive switch control signal $F_{sw}$. When switch control signal $F_{sw}$ has a logic high value, the n-channel MOSFET turns on, thus discharging capacitor 55.

In some embodiments, the p-channel MOSFET may be replaced by a second n-channel MOSFET. In that scenario, the drain of the second n-channel MOSFET is coupled to $C_{sw}$, its source is coupled to $V_{sw}$, and its gate is coupled to the inverse of the switch control signal $F_{sw}$. When switch control signal $F_{sw}$ has a logic low value, its inverse value has a logic high value, and the n-channel MOSFET turns on and charges capacitor 55. Other embodiments may use a parallel combination of a p-channel MOSFET and an n-channel MOSFET for the charging and/or discharging paths through switch 50.

Generally, the choice of circuitry or implementation for switch 55 depends on a variety of factors, as persons of ordinary skill in the art will understand. Such factors include design specifications, performance specifications, cost, IC or device area, available technology, such as semiconductor fabrication technology), target markets, target end-users, etc.

FIG. 3 shows a circuit arrangement for a signal processing circuit 30 according to an exemplary embodiment. Signal processing circuit 30 includes buffer 60 and capacitor 62 ($C_{DEC}$). Note that capacitor 62 is coupled at the input of signal processing circuit 30, i.e., at the output of switch-capacitor resistor 15 (see FIG. 1). Thus, capacitor 62 acts as a filter, and filters the output voltage $V_{sw}$ of switch-capacitor resistor 15.

The circuit arrangement for signal processing circuit 30 includes a voltage source, $V_{os}$, coupled between capacitor 62 and the input of buffer 60. Voltage source $V_{os}$ (or offset voltage $V_{os}$) represents an offset voltage, such as a random input offset voltage in buffer 60 because of mismatch effects, as persons of ordinary skill in the art will understand. By accounting for the offset voltage, signal processing circuit 30 allows more accurate calibration or measurement of the output current of current source 25.

Buffer 60 buffers its input voltage (the output voltage $V_{sw}$ plus offset voltage $V_{os}$), and provides a buffered voltage, $V_o$. In some embodiments, buffer 60 represents a unity-gain buffer, i.e., buffer 60 has a gain of 1. In other embodiments, buffer 60 may have a different gain value, with its gain value taken into account in the equations for calibrating or measuring currents, as persons of ordinary skill in the art will understand.

Figure 4:
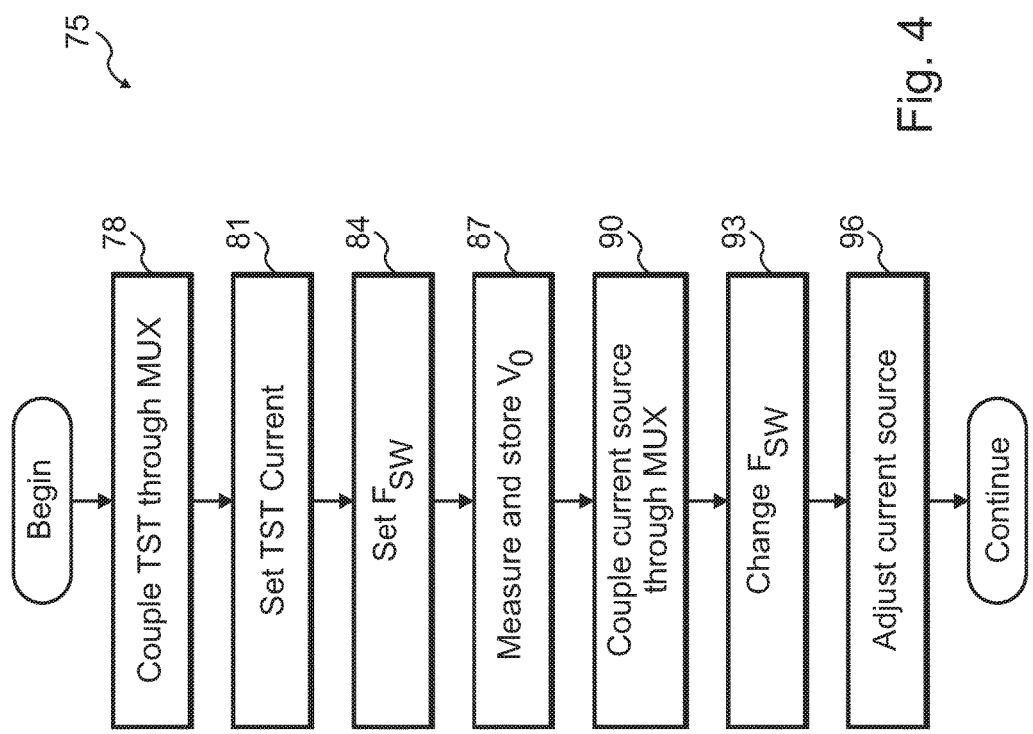
FIG. 4 depicts a process flow diagram for calibrating a current source according to an exemplary embodiment.

FIG. 4 depicts a process flow diagram 75 for calibrating a current source according to an exemplary embodiment. The process shown may be used to calibrate current source 25, using circuitry shown in FIGS. 1-3, and discussed above. Referring again to FIG. 4, at 78, MUX 20 is used to couple the test current signal $I_{TST}$ (received via the TST input) to switch-capacitor resistor 15 and signal processing circuit 30. At 81, the value of the test current signal $I_{TST}$ is set. In exemplary embodiments, the value of the test current signal $I_{TST}$ may be set by circuitry integrated in an IC, or via a pin or pad of the IC in cooperation with external circuitry, such as test apparatus (for testing ICs, for example). In exemplary embodiments, the value of the test current signal $I_{TST}$ is set to a relatively large value compared to the output current of current source 25, for example, 1 µA (for, say, a 10 nA output current of current source 25).

At 84, the frequency of the clock signal for switch-capacitor resistor 15, $F_{sw}$, is set to a relatively high frequency value (depending on the ratio of the value of test current signal $I_{TST}$ to the target value of current source 25), $F_0$. In exemplary embodiments, $F_0$ may have a variety of desired values, as persons of ordinary skill in the art will understand. In some embodiments, $F_0$ may have a value of 10 MHz. At 87, buffered voltage $V_o$ is measured and stored as initial value $V_{init}$. In exemplary embodiments, the buffered voltage $V_o$ may be measured by circuitry integrated in an IC (e.g., an analog to digital converter (ADC)), or via a pin or pad of the IC in cooperation with external circuitry, such as test apparatus (for testing ICs, for example). At 90, MUX 20 is used to couple current source 25 to switch-capacitor resistor 15 and signal processing circuit 30. At 93, the frequency $F_{sw}$ is changed to the value $(F_0 \cdot I_{TARGET}/I_{TST})$, where $I_{TARGET}$ denotes the target value for the current calibration process, i.e., the desired or target value for the current supplied by current source 25. At 96, current source 25 is changed by controller 35 such that buffered voltage $V_o$ equals (to the degree that the trim or change resolution that current source 25 allows or supports) the initial value $V_{init}$. After this process, the output current of current source 25 ($I_{source}$ in FIG. 1) will equal or nearly equal $I_{TARGET}$, independently of the value of the capacitance value $C_{SW}$, or other on-chip components. In particular, any input offset voltage (such as offset voltage $V_{os}$, attributable to buffer 60 in FIG. 3) is canceled by the calibration process.

Figure 5:
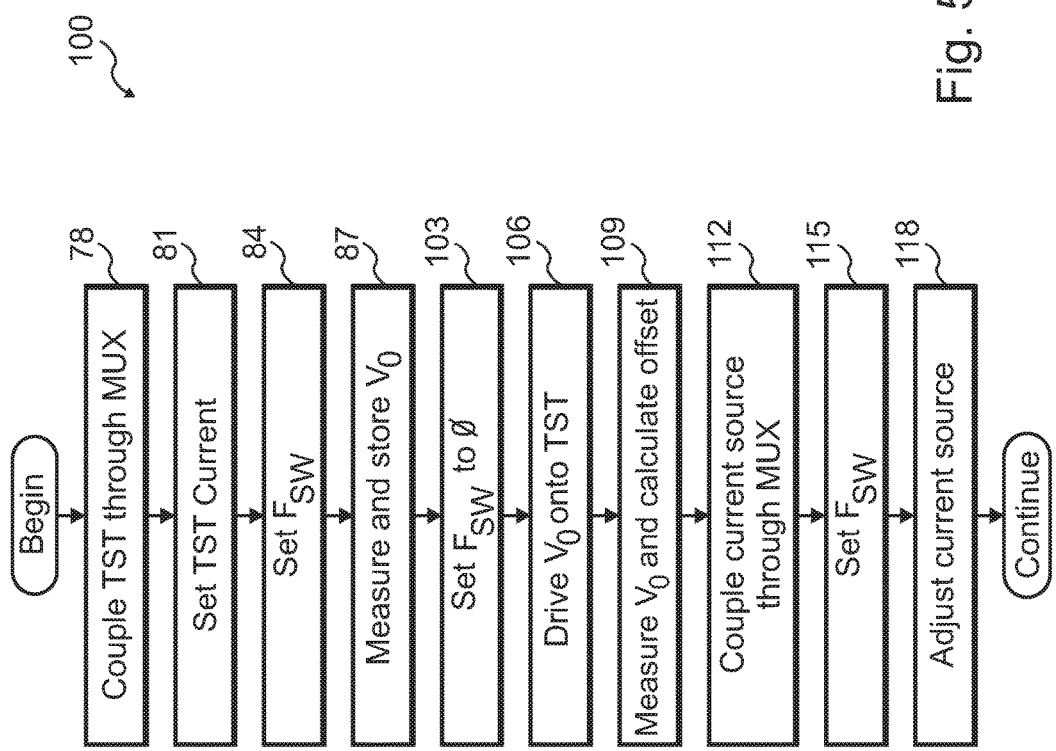
FIG. 5 illustrates a process flow diagram for calibrating a current source according to another exemplary embodiment.

Referring again to FIG. 4, changing the frequency $F_{sw}$ at 93 entails setting the frequency to a value that depends on $I_{TST}$ and $I_{TARGET}$. Although the value chosen for $I_{TST}$ is generally flexible in exemplary embodiments, in some situations, the available control resolution for $F_{sw}$ might be insufficient to obtain the desired frequency. In this case, the difference between the desired frequency, i.e., $(F_0 \cdot I_{TARGET}/I_{TST})$, and the actual frequency introduces an error in the calibration results. FIG. 5 shows a flow diagram 100 for a calibration process that corrects for limited control resolution in the frequency $F_{SW}$.

Similar to the process described above with respect to FIG. 4, the process in FIG. 5 includes blocks 78, 81, 84, and 87. At 103, however, the frequency $F_{SW}$ is set to a logic low value, i.e., switch 50 in switch-capacitor resistor 15 does not switch. At 106, controller 35 drives the previous measured voltage, the value stored as $V_{init}$, onto the TST input of MUX 20. At 109, the output voltage of buffer 60 is measured, and the offset voltage is calculated as $V_{os}=(V_o-V_{init})$. At 112, MUX 20 is used to couple current source 25 to switch-capacitor resistor 15 and signal processing circuit 30. At 115, the switching frequency $F_{sw}$ is set to a value close to or equal to $F_0 \cdot (I_{TARGET}/I_{TST})$, as allowed by the available control resolution of $F_{sw}$. At 118, controller 35 changes the output current of current source 25 by changing or controlling control signal $V_{control}$ such that the buffered voltage $V_o$ equals $(I_{TARGET}/I_{TST}) \cdot (F_0/F_{sw}) \cdot (V_{init}-V_{os})+V_{os}$, where $F_{sw}$ is the actual $F_{sw}$ value achieved at 115.

The above process effectively measures the value of $V_{os}$, and adjusts for the error in $F_{sw}$. If the offset voltage $V_{os}$ is known to be sufficiently small for a given implementation, 103 through 109 in FIG. 5 may be skipped, and a value of 0 can be used for $V_{os}$ in the equation used at 118.

One aspect of the disclosure relates to measuring electric currents. In exemplary embodiments, current measurement may be performed in addition to, or instead of, current calibration. More specifically, some embodiments implement current calibration. Other embodiments, however, implement current measurement. Yet other embodiments implement both current calibration and measurement. The calibration and measurement may be applied to the same current source or to different current sources, as desired.

Figure 6:
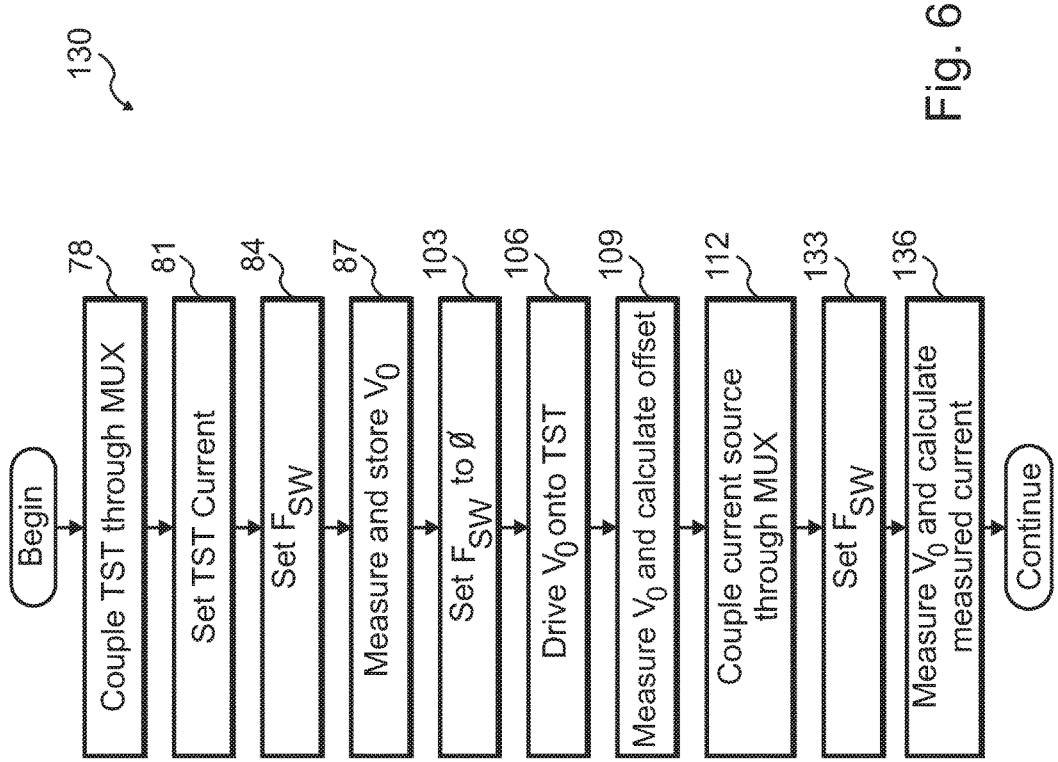
FIG. 6 depicts a process flow diagram for measuring the output current of a current source according to an exemplary embodiment.

The circuit arrangements shown in FIGS. 1-3 may be used to measure currents, for example, bias or other currents in an IC, without the addition of significant or relatively large error sources. FIG. 6 depicts a process flow diagram 130 for measuring the output current of a current source according to an exemplary embodiment.

Similar to the process described above with respect to FIG. 5, the process in FIG. 6 includes blocks 78, 81, 84, 87, 103, 106, 109, and 112. At 133, however, the frequency $F_{sw}$ is set to a value that makes $V_o$ as close to $V_{init}$ as allowed by the available control resolution (i.e., the resolution in changing the values) of $F_{sw}$. At 136, $V_o$ is measured, and the measured current (the output current, $I_{source}$, from current source 25, in this example, which would be available to circuitry other than MUX 20 once the measurement has concluded), is calculated as:

$$I_{meas}=I_{TST} \cdot (F_{sw}/F_0) \cdot (V_o-V_{os})/(V_{init}-V_{os}), \quad \text{[Equation 4]}$$

where $I_{meas}$ denotes the measured current, for instance, output current $I_{source}$, from current source 25, in this example.

Similar to the process in FIG. 5, the process in FIG. 6 effectively measures the value of $V_{os}$, and adjusts for the error in $F_{sw}$. If the offset voltage $V_{os}$ is known to be sufficiently small for a given implementation, 103 through 109 in FIG. 6 may be skipped, and a value of 0 can be used for $V_{os}$ in the equation used at 136.

Figure 7:
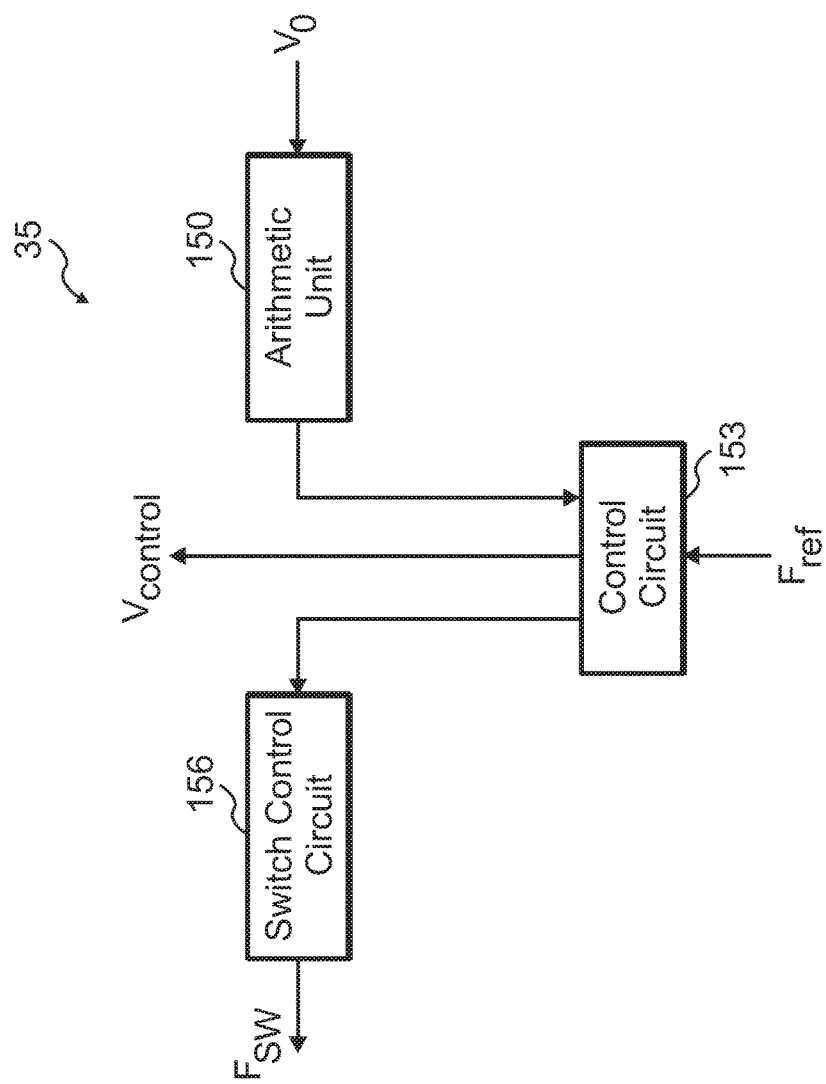
FIG. 7 illustrates a circuit arrangement for a controller according to an exemplary embodiment.

FIG. 7 illustrates a circuit arrangement for a controller 35 according to an exemplary embodiment. In the example shown, controller 35 includes an arithmetic unit 150 that receives a digital value representative of buffered voltage $V_o$ (e.g. from an analog-to-digital conversion of $V_o$), and uses that digital value to perform the calculations described above. The results of the calculations are provided to control circuit 153. Control circuit 153 further receives a reference frequency $F_{ref}$. Control circuit 153 uses the reference frequency $F_{ref}$ to generate control signal $V_{control}$, change the frequency of switch control signal $F_{sw}$, etc., as described above. In some embodiments, controller 35 may be formed by circuitry integrated into an IC, while in other embodiments, controller 35 may be formed by circuitry and/or software running in external test equipment.

In exemplary embodiments, reference frequency $F_{ref}$ may be obtained from a variety of sources. In some embodiments, if a source of sufficient accuracy/precision (for the application) is available on-chip (integrated in the IC), such as an on-chip oscillator, that source may be used. In some embodiments, an external source provides reference frequency $F_{ref}$. Examples of such external sources constitute oscillators, such as crystal oscillators (including ovenzied crystal oscillators), global positioning satellite (GPS) disciplined oscillators (GPSDOs) for applications specifying relatively high accuracy/precision, etc. In some embodiments, a test equipment, such as IC test equipment or automatic test equipment (ATE), provides reference frequency $F_{ref}$. The test equipment may obtain or generate reference frequency $F_{ref}$ using a variety of techniques or sources, such as the examples described above.

Similarly, in exemplary embodiments, test current signal $I_{TST}$ may be obtained from a variety of sources. In some embodiments, if a source of sufficient accuracy/precision (for the application) is available on-chip (integrated in the IC), that source may be used. In some embodiments, an external source provides test current signal $I_{TST}$. Examples of such external sources constitute current calibrators, current sources, transconductance amplifiers (coupled to a voltage source to provide an input voltage), etc. In some embodiments, a test equipment, such as IC test equipment or ATE, provides test current signal $I_{TST}$. The test equipment may obtain or generate test current signal $I_{TST}$ using a variety of techniques or sources, such as the examples described above.

Switch control circuit 156 generates control signals for switch 50 (see FIG. 2). In exemplary embodiments, switch control circuit 156 may be implemented using digital logic circuits, as persons of ordinary skill in the art will understand. Controller 35, including control circuit 153, may be implemented in a variety of ways. Examples include finite state machines (FSMs), custom logic, standard cell logic, etc., as persons of ordinary skill in the art will understand.

FIGS. 8-11 show circuit arrangements that use calibrated or measured current source(s) according to an exemplary embodiment. More specifically, the figures illustrate examples of circuits that include one or more current sources. The current source(s) may be calibrated and/or measured, using the disclosed techniques. As persons of ordinary skill in the art will understand, however, the disclosed techniques may be applied to a wide variety of other circuitry or circuitry having other elements, components, topologies, etc., that use one or more current sources 25.

Figure 8:
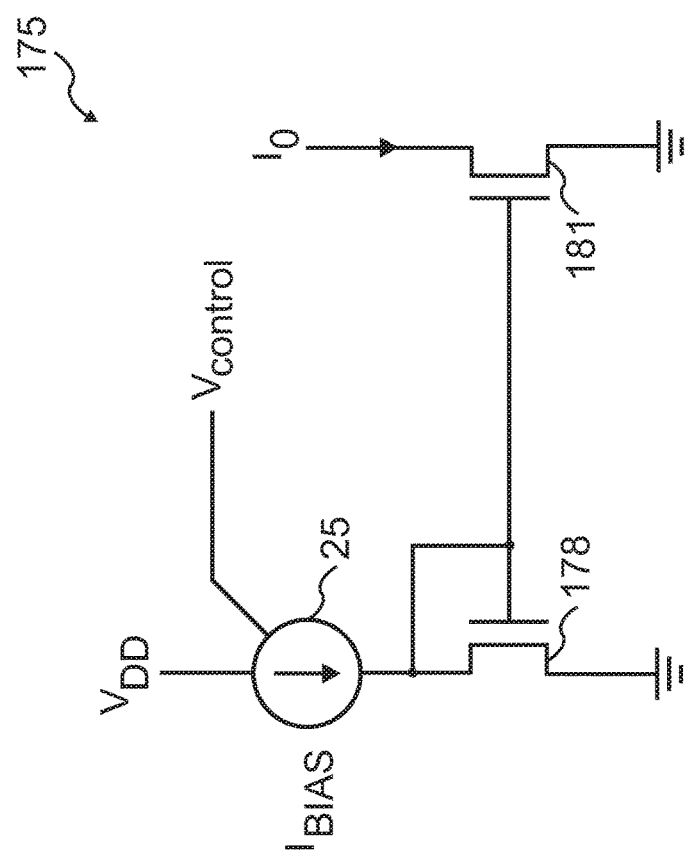
FIGS. 8-11 show circuit arrangements that use calibrated or measured current source(s) according to an exemplary embodiment.

FIG. 8 shows a current mirror 175 that includes current source 25, providing as its output current a bias current, $I_{bias}$. Current mirror 175 also includes MOSFETs 178 and 181, coupled in a configuration known to persons of ordinary skill in the art. Current source 25 may be calibrated and/or measured (the value of its output current may be measured), using the techniques described above. During measurement or calibration of current source 25, it will generally be uncoupled from current mirror 175 or current mirror 175 will otherwise be disabled to avoid pulling current from current source 25. This same procedure is generally used in exemplary embodiments for any circuit using a current source to be calibrated or measured using the techniques described above.

Figure 9:
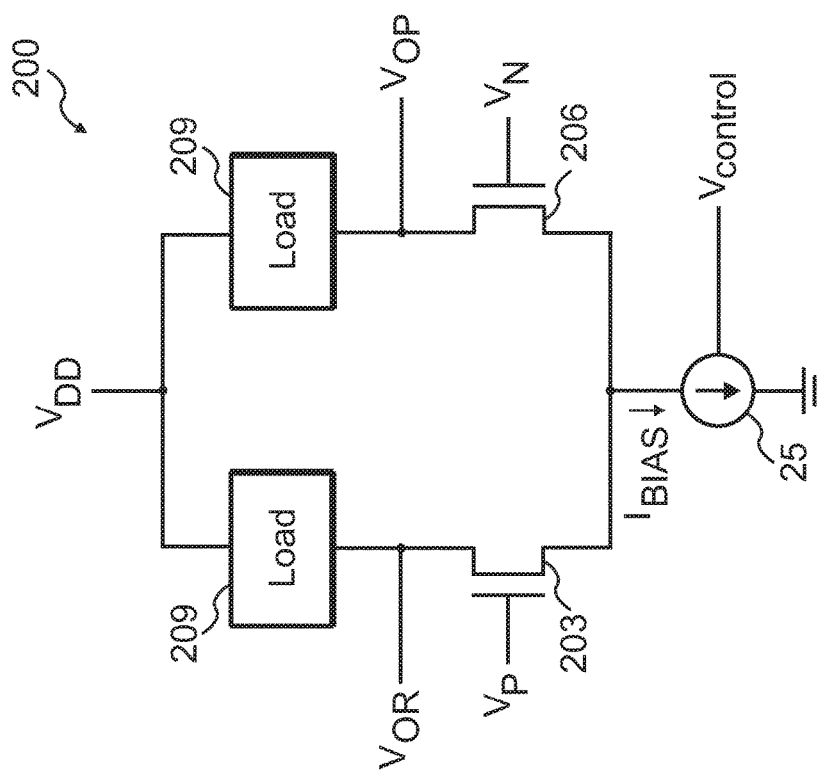

FIG. 9 shows an amplifier 200 that includes current source 25, acting as a current sink (i.e., it sinks a bias current, $I_{bias}$). Amplifier 200 also includes MOSFETs 203 and 206, and loads/load circuits 209, coupled in a differential amplifier configuration known to persons of ordinary skill in the art. Current source 25 may be calibrated and/or measured, using the techniques described above.

Figure 10:
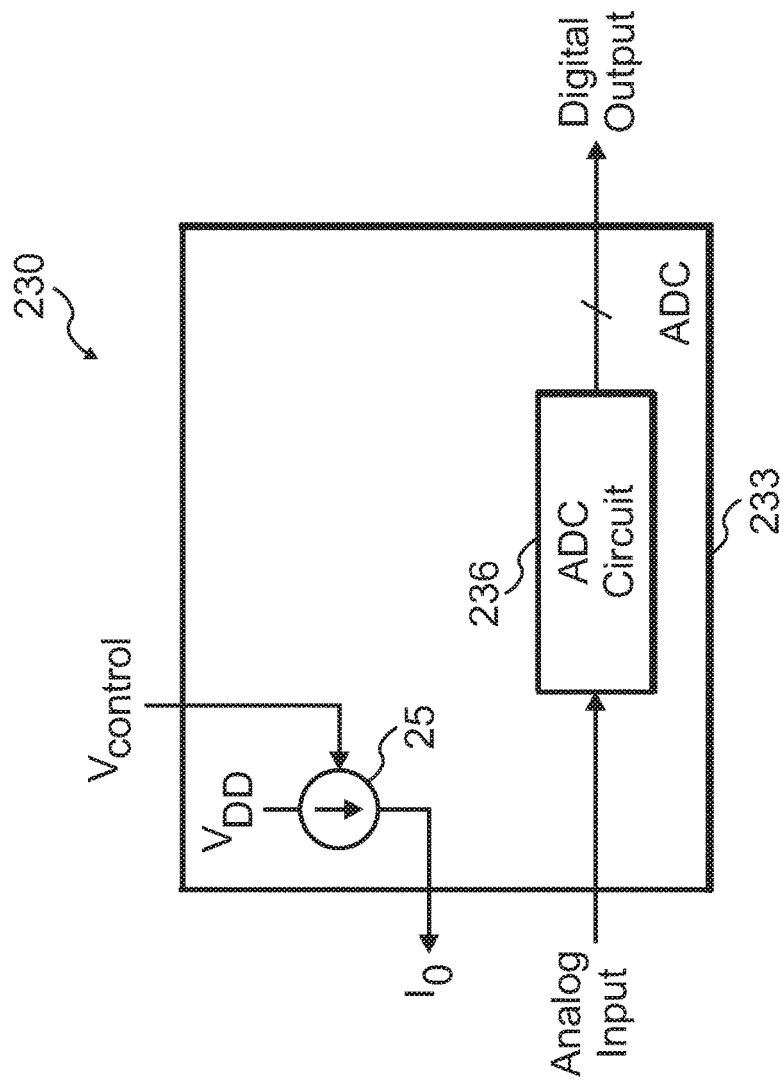

FIG. 10 shows a circuit arrangement 230 for an analog to digital converter (ADC) 233 that includes one or more current source(s) 25, providing as its/their output current(s) current $I_o$. Current(s) $I_o$ may be supplied to circuitry (not shown) that provides one or more analog input signals to ADC 233. Examples of such circuitry include sensors, transducers, etc., as persons of ordinary skill in the art will understand. ADC 233 also includes ADC circuit 236, which converts the analog input signal(s) into a digital output signal, as persons of ordinary skill in the art will understand. Current source(s) 25 may be calibrated and/or measured, using the techniques described above.

Figure 11:
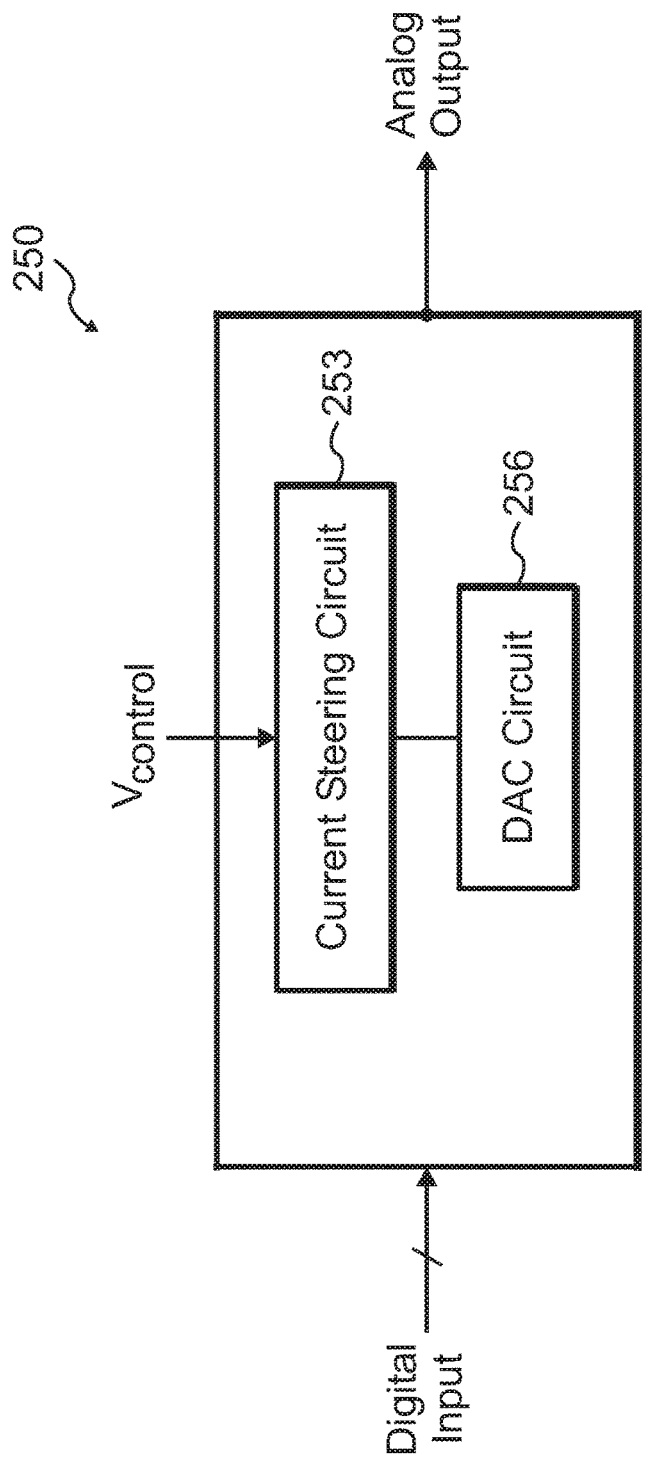

FIG. 11 shows a digital to analog converter (DAC) 250 that includes current steering circuit 253 and DAC circuit 256. Current steering circuit 253 includes one or more current source(s) 25. Current source(s) 25 may be calibrated and/or measured, using the techniques described above. Current steering circuit 253 operates in conjunction with DAC circuit 256 to convert a digital input signal of DAC 256 to an analog output signal, as persons of ordinary skill in the art will understand.

Figure 12:
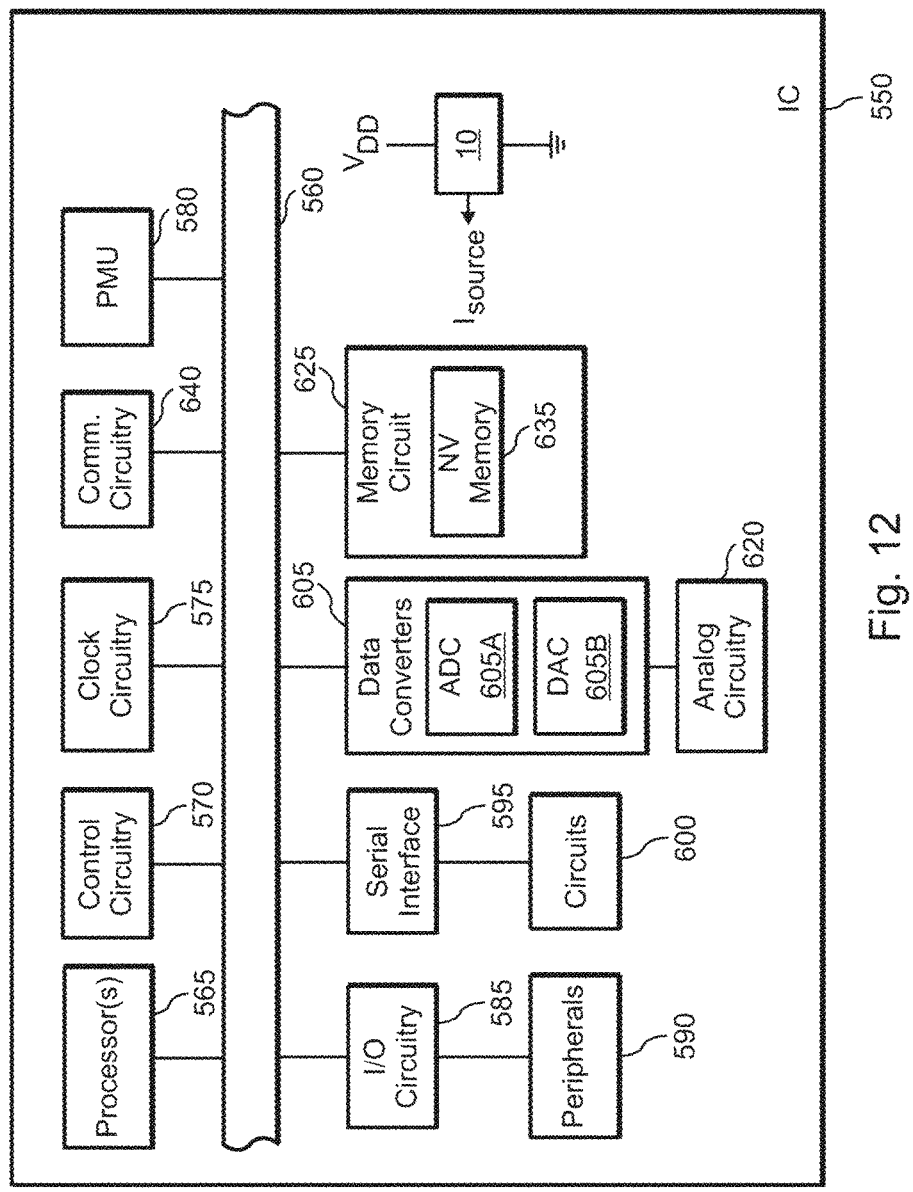
FIG. 12 illustrates a block diagram of an MCU that includes current calibration and/or measurement circuitry 10 according to an exemplary embodiment.

Current calibration and/or measurement circuitry and techniques according to the disclosure may be applied to a variety of circuitry, ICs, systems, subsystems, etc. FIG. 12 illustrates a block diagram 500 of an IC 550, more specifically, a microcontroller unit (MCU), that includes current calibration and/or measurement circuitry 10 according to an exemplary embodiment.

IC 550 constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, the ALUs or an ALU may be used to perform the calculations described above in calibrating and/or measuring currents. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 605B and/or one or more DACs 605A. The ADC(s) 615 receive analog signal(s) from analog circuitry 620, and convert the analog signal(s) to a digital format, which they communicate to one or more blocks coupled to link 560.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, sub-systems, control blocks, and information processing blocks, as desired.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560.

In some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause PMU 580, and circuitry such as controller 35, to reset to an initial state.

In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include USB, Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, and the like, as desired. In some embodiments, the memory read and/or write operations involve the use of one or more blocks in IC 550, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown). NV memory 635 may be used for storing information related to performance or configuration of one or more blocks in IC 550. For example, NV memory 635 may store configuration information related to current calibration and/or measurement circuitry 10, such as the frequency plan (e.g., values of reference frequency $F_{ref}$, frequency value $F_0$); measured, expected, or calculated values for offset voltage $V_{os}$; the value of test current signal $I_{TST}$; etc.

Various digital and/or mixed-signal circuits and blocks described above and used in exemplary embodiments may be implemented in a variety of ways and using a variety of circuit elements or blocks. For example, controller 35, arithmetic unit 150, control circuit 153, switch control circuit 156, the various blocks in FIG. 12, etc., may generally be implemented using digital circuitry. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. In addition, analog circuitry or mixed-signal circuitry or both may be included, for instance, power converters, discrete devices (transistors, capacitors, resistors, inductors, diodes, etc.), and the like, as desired. The analog circuitry may include bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology, target markets, target end-users, etc.

Various analog circuitry and blocks described above and used in exemplary embodiments may be implemented in a variety of ways and using a variety of circuit elements or blocks. For example, switch-capacitor resistor 15, current source 25, signal processing circuit 30, switch 50, buffer 60, etc., may generally be implemented using analog circuitry. The analog circuitry may include bias circuits, decoupling circuits, coupling circuits, supply circuits, current mirrors, current and/or voltage sources, filters, amplifiers, converters, signal processing circuits (e.g., multipliers), sensors or detectors, transducers, discrete components (transistors, diodes, resistors, capacitors, inductors), analog MUXs, and the like, as desired, and as persons of ordinary skill in the art will understand. In addition, digital circuitry or mixed-signal circuitry or both may be included. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
   an integrated circuit (IC), comprising:
      a current source, to sink or source an output current, in response to a control signal; and
      a switch-capacitor resistor coupled to the current source; and
   a controller coupled to derive the control signal from a voltage across the switch-capacitor resistor, the controller further to provide a switch control signal to the switch-capacitor resistor, wherein the controller uses the voltage across the switch-capacitor resistor to change a frequency of the switch control signal from a first frequency value to a second frequency value.

2. The apparatus according to claim 1, wherein the control signal is used by the controller to calibrate the current source.

3. The apparatus according to claim 1, wherein the second frequency value depends on the first frequency value and a target value of the output current.

4. The apparatus according to claim 3, further comprising a buffer to receive the voltage across the switch-capacitor resistor to provide a buffered voltage, wherein the control signal is derived from an offset voltage and the buffered voltage.

5. The apparatus according to claim 1, wherein a voltage derived from the voltage across the switch-capacitor resistor is used by the controller to measure the output current.

6. The apparatus according to claim 5, wherein the controller uses the voltage across the switch-capacitor resistor to change a frequency of the switch control signal from a first frequency value to a second frequency value.

7. The apparatus according to claim 6, further comprising a buffer to receive the voltage across the switch-capacitor resistor to provide a buffered voltage, wherein the controller uses the buffered voltage to measure the output current.

8. The apparatus according to claim 1, wherein the switch-capacitor resistor comprises a capacitor and a switch wherein, depending on a value of the switch control signal, the switch discharges the capacitor.

9. An apparatus, comprising:
   a microcontroller unit (MCU), comprising:
      a current source, to sink or source an output current, in response to a control signal;
      a switch-capacitor resistor coupled to the current source; and
      a signal processing circuit coupled to receive a voltage across the switch-capacitor resistor and to provide an output signal, the signal processing circuit having an offset voltage; and
   a controller coupled to derive the control signal from the output signal of the signal processing circuit and the offset voltage, the controller further to provide a switch control signal to the switch-capacitor resistor, wherein the controller uses the offset voltage to set a frequency of the switch control signal.

10. The apparatus according to claim 9, wherein the control signal is used to calibrate the output current.

11. The apparatus according to claim 9, wherein a voltage derived from the voltage across the switch-capacitor resistor is used by the controller to measure the output current.

12. The apparatus according to claim 9, wherein the switch-capacitor resistor comprises a capacitor coupled to a switch, wherein in response to a first value of the switch control signal the switch discharges the capacitor, and wherein in response to a second value of the switch control signal the switch couples the capacitor to the signal processing circuit.

13. The apparatus according to claim 9, wherein the signal processing circuit comprises:
   a capacitor coupled to the switch-capacitor resistor and to ground; and
   a buffer to buffer the voltage across the switch-capacitor resistor to generate the output signal of the signal processing circuit.

14. The apparatus according to claim 9, wherein the controller uses the voltage across the switch-capacitor resistor to change the frequency of the switch control signal from a first frequency value to a second frequency value.

15. The apparatus according to claim 14, wherein the second frequency value depends on the first frequency value and a target value of the output current.

16. A method comprising:
   sinking or sourcing an output current from a current source in response to a control signal;
   providing the output current to a switch-capacitor resistor;

deriving the control signal from a voltage across the switch-capacitor resistor; and providing a switch control signal to the switch-capacitor resistor, wherein an offset voltage is used to set a frequency of the switch control signal.

17. The method according to claim 16, further comprising using the control signal to calibrate the output current.

18. The method according to claim 16, further comprising using the switch control signal to measure the output current.

19. The method according to claim 16, further comprising:

filtering the voltage across the switch-capacitor; and
buffering the voltage across the switch-capacitor.

20. The method according to claim 16, wherein deriving the control signal from the voltage across the switch-capacitor resistor further comprises using an offset voltage to determine the control signal.

* * * * *